United States Patent
Kweskin (10) Patent No.: US 10,192,778 B2
(45) Date of Patent: Jan. 29, 2019

(54) SEMICONDUCTOR ON INSULATOR STRUCTURE COMPRISING A SACRIFICIAL LAYER AND METHOD OF MANUFACTURE THEREOF

(71) Applicant: SunEdison Semiconductor Limited (UEN201334164H), Singapore (SG)

(72) Inventor: Sasha Joseph Kweskin, St. Louis, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 15/917,123

(22) Filed: Mar. 9, 2018

(65) Prior Publication Data

US 2018/0197769 A1    Jul. 12, 2018

Related U.S. Application Data

(63) Continuation of application No. 15/450,124, filed on Mar. 6, 2017, now Pat. No. 10,026,642.

(60) Provisional application No. 62/304,387, filed on Mar. 7, 2016.

(51) Int. Cl.
| | | |
|---|---|---|
| *H01L 21/30* | (2006.01) | |
| *H01L 21/762* | (2006.01) | |
| *H01L 21/683* | (2006.01) | |
| *H01L 21/311* | (2006.01) | |
| *H01L 21/67* | (2006.01) | |

(52) U.S. Cl.
CPC .. *H01L 21/76254* (2013.01); *H01L 21/31111* (2013.01); *H01L 21/6835* (2013.01); *H01L 21/67017* (2013.01); *H01L 2221/68368* (2013.01); *H01L 2221/68381* (2013.01)

(58) Field of Classification Search
CPC ............. H01L 21/324; H01L 21/31111; H01L 21/6835; H01L 21/76254
USPC ......................................................... 438/458
See application file for complete search history.

(56) References Cited

U.S. PATENT DOCUMENTS

| | | | |
|---|---|---|---|
| 3,865,652 | A | 2/1975 | Agusta et al. |
| 4,341,818 | A | 7/1982 | Adams et al. |
| 4,755,865 | A | 7/1988 | Wilson et al. |
| 5,189,500 | A | 2/1993 | Kusunoki |
| 5,516,730 | A | 5/1996 | Pirooz et al. |
| 5,712,198 | A | 1/1998 | Shive et al. |
| 5,877,057 | A | 3/1999 | Gardner et al. |
| 6,043,138 | A | 3/2000 | Ibok |
| 6,303,482 | B1 | 10/2001 | Wu et al. |
| 6,373,113 | B1 | 4/2002 | Gardner et al. |
| 6,562,127 | B1 | 5/2003 | Kud et al. |

(Continued)

FOREIGN PATENT DOCUMENTS

| | | | |
|---|---|---|---|
| EP | 0939430 | A2 | 1/1999 |
| EP | 1041621 | A2 | 10/2000 |

(Continued)

OTHER PUBLICATIONS

Kerr, Daniel C., Identification of RF harmonic distortion of Si substrates and its reduction using a trap-rich layer, IEEE (IEEE Topical Meeting), 2008, pp. 151-154.

(Continued)

*Primary Examiner* — Brook Kebede
(74) *Attorney, Agent, or Firm* — Armstrong Teasdale LLP (57) ABSTRACT

A method is provided for preparing a semiconductor-on-insulator structure comprising a sacrificial layer.

23 Claims, 7 Drawing Sheets

(56) References Cited

U.S. PATENT DOCUMENTS

| | | |
|---|---|---|
| 6,624,047 B1 | 9/2003 | Sakaguchi et al. |
| 7,531,430 B2 | 5/2009 | Kononchuk |
| 7,868,419 B1 | 1/2011 | Kerr et al. |
| 7,915,716 B2 | 3/2011 | Pisigan et al. |
| 8,076,750 B1 | 12/2011 | Kerr et al. |
| 8,466,036 B2 | 6/2013 | Brindle et al. |
| 8,481,405 B2 | 7/2013 | Arriagada et al. |
| 2006/0015442 A1 | 1/2006 | Burkhardt et al. |
| 2007/0032040 A1 | 2/2007 | Lederer |
| 2008/0102603 A1 | 5/2008 | Kobayashi et al. |
| 2010/0044718 A1 | 2/2010 | Hanser et al. |
| 2012/0016310 A1 | 1/2012 | Holliday et al. |
| 2012/0034758 A1* | 2/2012 | Koezuka .............. H01L 21/324 438/458 |
| 2012/0119323 A1* | 5/2012 | Akiyama .............. H01L 21/265 257/507 |
| 2012/0238070 A1 | 9/2012 | Libbert et al. |
| 2013/0168835 A1 | 7/2013 | Botula et al. |
| 2013/0193445 A1 | 8/2013 | Dennard et al. |
| 2013/0240830 A1 | 9/2013 | Seacrist et al. |
| 2014/0084290 A1 | 3/2014 | Allibert et al. |

FOREIGN PATENT DOCUMENTS

| | | |
|---|---|---|
| KR | 930000227 B1 * | 1/1993 |
| WO | 2009066135 A1 | 5/2009 |
| WO | 2009120407 A2 | 10/2009 |
| WO | 20100034696 A1 | 4/2010 |

OTHER PUBLICATIONS

Gamble, H. S. et al., Low-Loss CPW Lines on Surface Stabilized High-Resistivity Silicon, IEEE Microwave and Guided Wave Letters, Oct. 1999, pp. 395-397, vol. 9, No. 10.

Lederer, D. et al., Enhanced High resistivity SOI wafers for RF applications, 2004 IEEE International SOI Conference, Oct. 2004, pp. 46-47.

Lederer, D. et al., New Substrate Passivation Method Dedicated to HR SOI Wafer Fabrication With Increased Substrate Resistivity, IEEE Electron Device Letters, Nov. 2005, pp. 805-807, vol. 26, No. 11.

Lederer, D. et. al, Performance of SOI devices transferred onto passivated HR SOI substrates using a layer transfer technique, 2006 IEEE International SOI Conference Proceedings, 2006, pp. 29-30.

* cited by examiner

SEMICONDUCTOR ON INSULATOR STRUCTURE COMPRISING A SACRIFICIAL LAYER AND METHOD OF MANUFACTURE THEREOF

CROSS REFERENCE TO RELATED APPLICATION(S)

This application is a continuation of U.S. application Ser. No. 15/450,124, filed Mar. 6, 2017, the disclosure of which is hereby incorporated by reference as if set forth in its entirety. U.S. application Ser. No. 15/450,124 claims the benefit of priority to U.S. provisional application Ser. No. 62/304,387, which was filed Mar. 7, 2016, the disclosure of which is hereby incorporated by reference as if set forth in its entirety.

FIELD OF THE INVENTION

The present invention generally relates to the field of semiconductor wafer manufacture. More specifically, the present invention relates to a method of a semiconductor-on-insulator (e.g., silicon-on-insulator) structure.

BACKGROUND OF THE INVENTION

Semiconductor wafers are generally prepared from a single crystal ingot (e.g., a silicon ingot) which is trimmed and ground to have one or more flats or notches for proper orientation of the wafer in subsequent procedures. The ingot is then sliced into individual wafers. While reference will be made herein to semiconductor wafers constructed from silicon, other materials may be used to prepare semiconductor wafers, such as germanium, silicon carbide, silicon germanium, gallium arsenide, and other alloys of Group III and Group V elements, such as gallium nitride or indium phosphide, or alloys of Group II and Group VI elements, such as cadmium sulfide or zinc oxide.

Semiconductor wafers (e.g., silicon wafers) may be utilized in the preparation of composite layer structures. A composite layer structure (e.g., a semiconductor-on-insulator, and more specifically, a silicon-on-insulator (SOI) structure) generally comprises a handle wafer or layer, a device layer, and an insulating (i.e., dielectric) film (typically an oxide layer) between the handle layer and the device layer. Generally, the device layer is between 0.01 and 20 micrometers thick, such as between 0.05 and 20 micrometers thick. Thick film device layers may have a device layer thickness between about 1.5 micrometers and about 20 micrometers. Thin film device layers may have a thickness between about 0.01 micrometer and about 0.20 micrometer. In general, composite layer structures, such as silicon-on-insulator (SOI), silicon-on-sapphire (SOS), and silicon-on-quartz, are produced by placing two wafers in intimate contact, thereby initiating bonding by van der Waal's forces, followed by a thermal treatment to strengthen the bond. The anneal may convert the terminal silanol groups to siloxane bonds between the two interfaces, thereby strengthening the bond.

After thermal anneal, the bonded structure undergoes further processing to remove a substantial portion of the donor wafer to achieve layer transfer. For example, wafer thinning techniques, e.g., etching or grinding, may be used, often referred to as back etch SOI (i.e., BESOI), wherein a silicon wafer is bound to the handle wafer and then slowly etched away until only a thin layer of silicon on the handle wafer remains. See, e.g., U.S. Pat. No. 5,189,500, the disclosure of which is incorporated herein by reference as if set forth in its entirety. This method is time-consuming and costly, wastes one of the substrates and generally does not have suitable thickness uniformity for layers thinner than a few microns.

Another common method of achieving layer transfer utilizes a hydrogen implant followed by thermally induced layer splitting. Particles (atoms or ionized atoms, e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer is cleaned to remove organic compounds or other contaminants, such as boron compounds, deposited on the wafer during the implantation process.

The front surface of the donor wafer is then bonded to a handle wafer to form a bonded wafer through a hydrophilic bonding process. Prior to bonding, the donor wafer and/or handle wafer are activated by exposing the surfaces of the wafers to plasma containing, for example, oxygen or nitrogen. Exposure to the plasma modifies the structure of the surfaces in a process often referred to as surface activation, which activation process renders the surfaces of one or both of the donor water and handle wafer hydrophilic. The surfaces of the wafers can be additionally chemically activated by a wet treatment, such as an SC1 clean or hydrofluoric acid. The wet treatment and the plasma activation may occur in either order, or the wafers may be subjected to only one treatment. The wafers are then pressed together, and a bond is formed there between. This bond is relatively weak, due to van der Waal's forces, and must be strengthened before further processing can occur.

In some processes, the hydrophilic bond between the donor wafer and handle wafer (i.e., a bonded wafer) is strengthened by heating or annealing the bonded wafer pair. In some processes, wafer bonding may occur at low temperatures, such as between approximately 300° C. and 500° C. In some processes, wafer bonding may occur at high temperatures, such as between approximately 800° C. and 1100° C. The elevated temperatures cause the formation of covalent bonds between the adjoining surfaces of the donor wafer and the handle wafer, thus solidifying the bond between the donor wafer and the handle wafer. Concurrently with the heating or annealing of the bonded wafer, the particles earlier implanted in the donor wafer weaken the cleave plane.

A portion of the donor wafer is then separated (i.e., cleaved) along the cleave plane from the bonded wafer to form the SOI wafer. Cleaving may be carried out by placing the bonded wafer in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming an SOI wafer.

According to other methods, the bonded pair may instead be subjected to an elevated temperature over a period of time to separate the portion of the donor wafer from the bonded wafer. Exposure to the elevated temperature causes initiation and propagation of cracks along the cleave plane, thus separating a portion of the donor wafer. The crack forms due to the formation of voids from the implanted ions, which grow by Ostwald ripening. The voids are filled with hydrogen and helium. The voids become platelets. The pressurized gases in the platelets propagate micro-cavities and micro-cracks, which weaken the silicon on the implant plane. If the anneal is stopped at the proper time, the weakened bonded wafer may be cleaved by a mechanical process. However, if the thermal treatment is continued for a longer duration and/or at a higher temperature, the micro-crack propagation reaches the level where all cracks merge along the cleave plane, thus separating a portion of the donor wafer. This method allows for better uniformity of the transferred layer and allows recycle of the donor wafer, but typically requires heating the implanted and bonded pair to temperatures approaching 500° C.

Complications associated with multilayer SOI structures include variations in flatness and sensitivity to defects at the bond interface. Common solutions to this include CMP, which is costly and may leave scratches or thickness variation. The traditional SOI structure specifications include electrical characteristic that can be easily integrated into devices.

SUMMARY OF THE INVENTION

The present invention is directed to a method for preparing a multilayer semiconductor on insulator structure. The method comprises bonding a handle semiconductor oxide layer in interfacial contact with a front surface of a single crystal semiconductor handle substrate to a donor semiconductor nitride layer in interfacial contact with a donor semiconductor oxide layer in interfacial contact with a front surface of a single crystal semiconductor donor substrate to thereby prepare a bonded structure, wherein (i) the single crystal semiconductor donor substrate comprises two major, generally parallel surfaces, one of which is the front surface of the semiconductor donor substrate and the other of which is the back surface of the semiconductor donor substrate, a circumferential edge joining the front and back surfaces of the semiconductor donor substrate, a central plane between the front and back surfaces of the semiconductor donor substrate, and a bulk region between the front and back surfaces of the semiconductor donor substrate, wherein the single crystal semiconductor donor substrate comprises a cleave plane, and (ii) the single crystal semiconductor handle substrate comprises two major, generally parallel surfaces, one of which is the front surface of the single crystal semiconductor handle substrate and the other of which is a back surface of the single crystal semiconductor handle substrate, a circumferential edge joining the front surface and the back surface of the single crystal semiconductor handle substrate, a central plane between the front surface and the back surface of the single crystal semiconductor handle substrate, and a bulk region between the front and back surfaces of the single crystal semiconductor handle substrate, and further wherein the handle semiconductor oxide layer has a wet etch rate ratio greater than 2.

Other objects and features will be in part apparent and in part pointed out hereinafter.

DETAILED DESCRIPTION OF THE EMBODIMENT(S) OF THE INVENTION

The present invention is directed to a multi-layered semiconductor-on-insulator structure (SOI, e.g., a silicon-on-insulator structure) that resists impurities contained in a handle substrate from having an influence on the device. The dielectric layer in the semiconductor-on-insulator structure may comprise one or more insulating layers located between the handle substrate and the donor substrate or device layer. The one or more insulating layers in the SOI structure according to the present invention may include silicon nitride, silicon oxide, silicon oxynitride, and combinations of these materials. Preferably, the dielectric layer comprises a multilayer comprising at least two insulating layers comprising these materials, or at least three insulating layers, or more insulating layers. According to some embodiments of the present invention, the insulating layer may comprises an oxide-nitride-oxide dielectric (ONO) in which an oxide layer in interfacial contact with the handle substrate an a second oxide layer is in interfacial contact with the donor substrate or device layer. The nitride layer is between the two oxide layers.

In a multi-layered semiconductor-on-insulator structure (SOI, e.g., a silicon on insulator structure) comprising an oxide-nitride-oxide dielectric layer (ONO), the buried oxide under the nitride may not be present in the final device. Therefore, process steps that are newly available in the deposition, treatment, and integration can reduce the cost and facilitate customer manufacturing.

According to some embodiments, a method is disclosed to facilitate the transfer of a layer or multilayer. By weakening the underlayer or adhesion of the underlayer, thereby making the etch rate faster/more selective or the undercut faster/more selective, the devices or patterns can be etched back, transferred, or lifted off more easily. Supposing that the underlayer is a sacrificial layer, there are fewer restrictions on the quality (i.e. bird's beak, interface traps, dielectric constant and breakdown). Given a greater window of operation, the cost of the SOI wafer can be reduced, the process can be made more robust, and value can be added to the wafer by facilitating the customer's layer transfer process. The purpose of this method is to improve reliability and reduce cost of multilayer SOI structures.

I. Semiconductor Handle Substrate and Semiconductor Donor Substrate

The substrates for use in the present invention include a semiconductor handle substrate, e.g., a single crystal semiconductor handle wafer and a semiconductor donor substrate, e.g., a single crystal semiconductor donor wafer. The semiconductor device layer in a semiconductor-on-insulator composite structure is derived from the single crystal semiconductor donor wafer. The semiconductor device layer may be transferred onto the semiconductor handle substrate by wafer thinning techniques such as etching a semiconductor donor substrate or by cleaving a semiconductor donor substrate comprising a damage plane. According to the method of the present invention, one or more insulating layers may be prepared on the surfaces of either or both the single crystal semiconductor handle wafer and the single crystal semiconductor donor wafer.

Figure 1A:
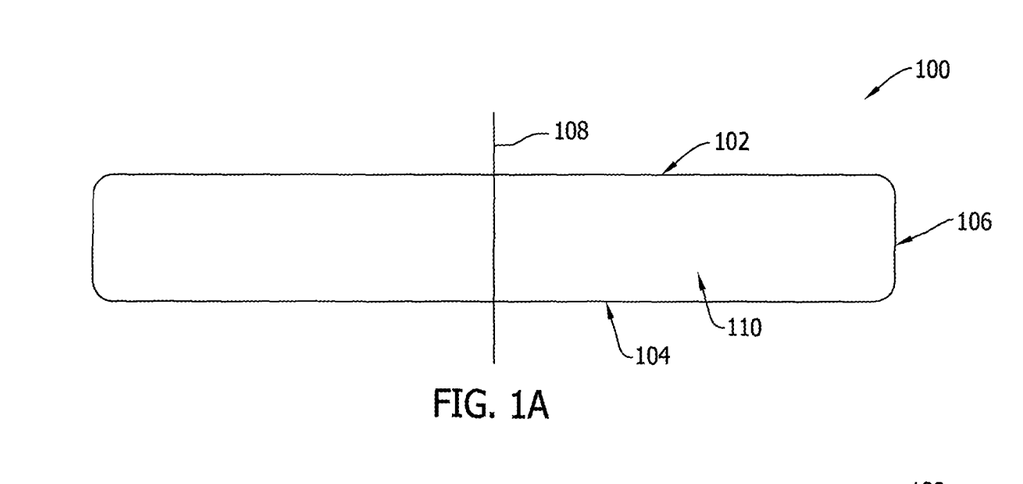
FIGS. 1A and 1B depict a process flow according to some embodiments of the present invention.

With reference to FIG. 1A, an exemplary, non-limiting single crystal semiconductor handle substrate or wafer 100 is depicted. In general, the single crystal semiconductor handle wafer 100 comprises two major, generally parallel surfaces. One of the parallel surfaces is a front surface 102 of the single crystal semiconductor handle wafer 100, and the other parallel surface is a back surface 104 of the single crystal semiconductor handle wafer 100. The single crystal semiconductor handle wafer 100 comprises a circumferential edge 106 joining the front and back surfaces 102, 104. The single crystal semiconductor handle wafer 100 comprise a central axis 108 perpendicular to the two major, generally parallel surfaces 102, 104 and also perpendicular to a central plane defined by the points midway between the front and back surfaces 102, 104. The single crystal semiconductor handle wafer 100 comprises a bulk region 110 between the two major, generally parallel surfaces 102, 104. Since semiconductor wafers, e.g., silicon wafers, typically have some total thickness variation (TTV), warp, and bow, the midpoint between every point on the front surface 102 and every point on the back surface 104 may not precisely fall within a plane. As a practical matter, however, the TTV, warp, and bow are typically so slight that to a close approximation the midpoints can be said to fall within an imaginary central plane which is approximately equidistant between the front and back surfaces 102, 104.

Prior to any operation as described herein, the front surface 102 and the back surface 104 of the single crystal semiconductor handle wafer 100 may be substantially identical. A surface is referred to as a "front surface" or a "back surface" merely for convenience and generally to distinguish the surface upon which the operations of method of the present invention are performed. In the context of the present invention, a "front surface" of a single crystal semiconductor handle wafer 100, e.g., a single crystal silicon handle wafer, refers to the major surface of the substrate that becomes an interior surface of the bonded structure. Accordingly, a "back surface" of a single crystal semiconductor handle wafer 100, e.g., a handle wafer, refers to the major surface that becomes an exterior surface of the bonded structure. Similarly, a "front surface" of a single crystal semiconductor donor substrate, e.g., a single crystal silicon donor wafer, refers to the major surface of the single crystal semiconductor donor substrate that becomes an interior surface of the bonded structure, and a "back surface" of a single crystal semiconductor donor substrate, e.g., a single crystal silicon donor wafer, refers to the major surface that becomes an exterior surface of the bonded structure. In the context of the present invention, one or more insulating layers may be prepared on the front surfaces of either or both the single crystal semiconductor handle substrate 100 and the single crystal semiconductor donor substrate. Upon completion of conventional bonding and wafer thinning steps, the single crystal semiconductor donor substrate forms the semiconductor device layer of the semiconductor-on-insulator (e.g., silicon-on-insulator) composite structure.

The single crystal semiconductor handle substrate and the single crystal semiconductor donor substrate may be single crystal semiconductor wafers. In preferred embodiments, the semiconductor wafers comprise a material selected from the group consisting of silicon, silicon carbide, silicon germanium, gallium arsenide, gallium nitride, indium phosphide, indium gallium arsenide, germanium, and combinations thereof. The single crystal semiconductor wafers, e.g., the single crystal silicon handle wafer and single crystal silicon donor wafer, of the present invention typically have a nominal diameter of at least about 150 mm, at least about 200 mm, at least about 300 mm, or at least about 450 mm. Wafer thicknesses may vary from about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers. In some embodiments, the wafer thickness may be about 775 micrometers.

In particularly preferred embodiments, the single crystal semiconductor wafers comprise single crystal silicon wafers which have been sliced from a single crystal ingot grown in accordance with conventional Czochralski crystal growing methods or float zone growing methods. Such methods, as well as standard silicon slicing, lapping, etching, and polishing techniques are disclosed, for example, in F. Shimura, Semiconductor Silicon Crystal Technology, Academic Press, 1989, and Silicon Chemical Etching, (J. Grabmaier ed.) Springer-Verlag, N.Y., 1982 (incorporated herein by reference). Preferably, the wafers are polished and cleaned by standard methods known to those skilled in the art. See, for example, W. C. O'Mara et al., Handbook of Semiconductor Silicon Technology, Noyes Publications. If desired, the wafers can be cleaned, for example, in a standard SC1/SC2 solution. In some embodiments, the single crystal silicon wafers of the present invention are single crystal silicon wafers which have been sliced from a single crystal ingot grown in accordance with conventional Czochralski ("Cz") crystal growing methods, typically having a nominal diameter of at least about 150 mm, at least about 200 mm, at least about 300 mm, or at least about 450 mm. Preferably, both the single crystal silicon handle wafer and the single crystal silicon donor wafer have mirror-polished front surface finishes that are free from surface defects, such as scratches, large particles, etc. Wafer thickness may vary from about 250 micrometers to about 1500 micrometers, such as between about 300 micrometers and about 1000 micrometers, suitably within the range of about 500 micrometers to about 1000 micrometers. In some specific embodiments, the wafer thickness may be between about 725 micrometers and about 800 micrometers, such as between about 750 micrometers and about 800 micrometers. In some embodiments, the wafer thickness may be about 725 micrometers. In some embodiments, the wafer thickness may be about 775 micrometers.

In some embodiments, the single crystal semiconductor wafers, i.e., single crystal semiconductor handle wafer and single crystal semiconductor donor wafer, comprise interstitial oxygen in concentrations that are generally achieved by the Czochralski-growth method. In some embodiments, the single crystal semiconductor wafers comprise oxygen in a concentration between about 4 PPMA and about 18 PPMA. In some embodiments, the semiconductor wafers comprise oxygen in a concentration between about 10 PPMA and about 35 PPMA. In some embodiments, the single crystal silicon wafer comprises oxygen in a concentration of no greater than about 10 PPMA. Interstitial oxygen may be measured according to SEMI MF 1188-1105.

The single crystal semiconductor handle wafer 100 may have any resistivity obtainable by the Czochralski or float zone methods. Accordingly, the resistivity of the single crystal semiconductor handle wafer 100 is based on the requirements of the end use/application of the structure of the present invention. The resistivity may therefore vary from milliohm or less to megaohm or more. In some embodiments, the single crystal semiconductor handle wafer 100 comprises a p-type or an n-type dopant. Suitable dopants include boron (p type), gallium (p type), phosphorus (n type), antimony (n type), and arsenic (n type). The dopant concentration is selected based on the desired resistivity of the handle wafer. In some embodiments, the single crystal semiconductor handle substrate comprises a p-type dopant. In some embodiments, the single crystal semiconductor handle substrate is a single crystal silicon wafer comprising a p-type dopant, such as boron.

In some embodiments, the single crystal semiconductor handle wafer 100 has a relatively low minimum bulk resistivity, such as below about 100 ohm-cm, below about 50 ohm-cm, below about 1 ohm-cm, below about 0.1 ohm-cm, or even below about 0.01 ohm-cm. In some embodiments, the single crystal semiconductor handle substrate 100 has a relatively low minimum bulk resistivity, such as below about 100 ohm-cm, or between about 1 ohm-cm and about 100 ohm-cm. Low resistivity wafers may comprise electrically active dopants, such as boron (p type), gallium (p type), aluminum (p type), indium (p type), phosphorus (n type), antimony (n type), and arsenic (n type).

In some embodiments, the single crystal semiconductor handle wafer 100 has a relatively high minimum bulk resistivity. High resistivity wafers are generally sliced from single crystal ingots grown by the Czochralski method or float zone method. High resistivity wafers may comprise electrically active dopants, such as boron (p type), gallium (p type), aluminum (p type), indium (p type), phosphorus (n type), antimony (n type), and arsenic (n type), in generally very low concentrations. Cz-grown silicon wafers may be subjected to a thermal anneal at a temperature ranging from about 600° C. to about 1000° C. in order to annihilate thermal donors caused by oxygen that are incorporated during crystal growth. In some embodiments, the single crystal semiconductor handle wafer has a minimum bulk resistivity of at least 100 Ohm-cm, or even at least about 500 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 1000 Ohm-cm and about 6000 ohm-cm, between about 2000 Ohm-cm and about 10,000 Ohm-cm, between about 3000 Ohm-cm and about 10,000 Ohm-cm, or between about 3000 Ohm-cm and about 5,000 Ohm-cm. In some preferred embodiments, the single crystal semiconductor handle substrate has a bulk resistivity between about 1000 Ohm-cm and about 6,000 Ohm-cm. Methods for preparing high resistivity wafers are known in the art, and such high resistivity wafers may be obtained from commercial suppliers, such as SunEdison Semiconductor Ltd. (St. Peters, Mo.; formerly MEMC Electronic Materials, Inc.).

In some embodiments, the single crystal semiconductor handle substrate comprises boron, which may be present in a concentration less than about $1 \times 10^{13}$ atoms/cm$^3$, such as less than about $5 \times 10^{12}$ atoms/cm$^3$, or less than about $1 \times 10^{12}$ atoms/cm$^3$. Methods for preparing high resistivity wafers are known in the art, and such high resistivity wafers may be obtained from commercial suppliers, such as SunEdison Semiconductor Ltd. (St. Peters, Mo.; formerly MEMC Electronic Materials, Inc.).

The single crystal semiconductor handle wafer 100 may comprise single crystal silicon. The single crystal semiconductor handle wafer 100 may have, for example, any of (100), (110), or (111) crystal orientation, and the choice of crystal orientation may be dictated by the end use of the structure.

II. Oxidation of the Single Crystal Semiconductor Handle Substrate

Figure 1B:
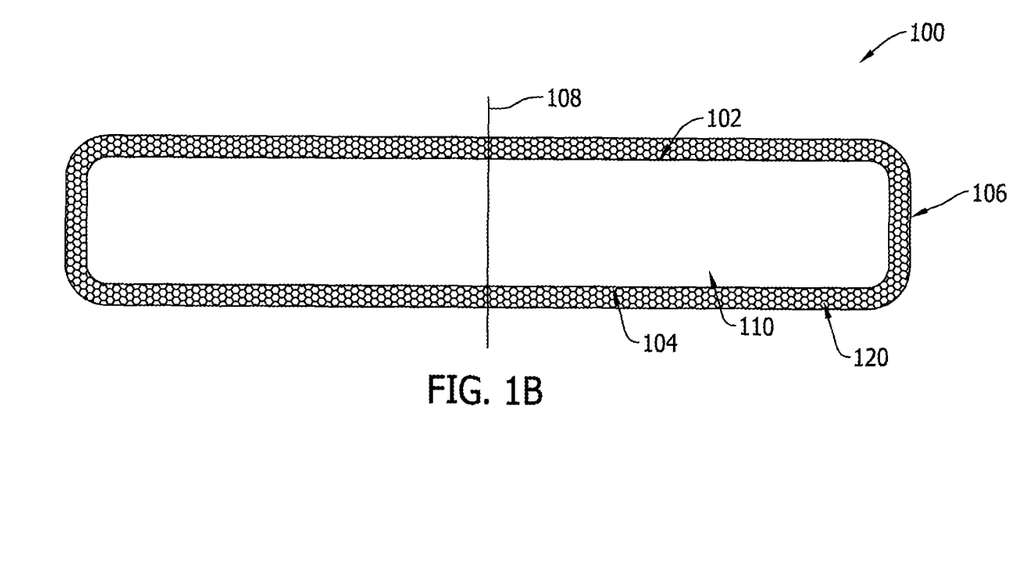

According to the method of the present invention, and with reference to FIG. 1B, the single crystal semiconductor handle substrate 100 is oxidized. Optionally, the front surface 102, the back surface 104, or both the front surface 102 and the back surface 104 and the circumferential edge 106 of the wafer may be oxidized to thereby form an oxidation layer 120. At least the front surface 102 of the single crystal semiconductor handle substrate 100 is oxidized. In some embodiments, the oxidation layer envelopes the single crystal semiconductor handle substrate 100. The single crystal semiconductor handle substrate 100 is preferably oxidized by CVD oxide deposition, such as plasma enhanced chemical vapor deposition. The oxidation layer on the front surface 102, the back surface 104, or both may be at least about 1 nanometer thick, such as between about 10 nanometers and about 5000 nanometers thick, such as between about 100 nanometers and about 1000 nanometers, or between about 200 nanometers and about 400 nanometers. In some embodiments, the oxidation layer is relatively thin, such as between about 5 angstroms and about 25 angstroms, such as between about 10 angstroms and about 15 angstroms. Thin oxide layers can be obtained by exposure to a standard cleaning solution, such as an SC1/SC2 cleaning solution.

In some embodiments, the semiconductor handle substrate may be oxidized by CVD oxide. In some embodiments, the ambient atmosphere comprises silane ($SiH_4$) and oxygen ($O_2$). In some embodiments, the ambient atmosphere comprises dichlorosilane ($SiCl_2H_2$) and nitrous oxide ($N_2O$). In some embodiments, the ambient atmosphere comprises tetraethylorthosilicate ($Si(OC_2H_5)_4$). CVD oxide may be deposited on the wafers in a CVD tool, e.g. commercially available Walker Johnson. Chemical vapor deposition of the oxide layer generally occurs at temperatures between about 300° C. and about 900° C. The temperature may vary depending upon the particular recipe selected for CVD oxide. For example, silane ($SiH_4$) and oxygen ($O_2$) generally deposits silicon dioxide at temperatures between about 300° C. and about 500° C. Dichlorosilane ($SiCl_2H_2$) and nitrous oxide ($N_2O$) generally deposits silicon dioxide at temperatures between about 700° C. and about 900° C. Tetraethylorthosilicate ($Si(OC_2H_5)_4$) generally deposits silicon dioxide at temperatures between about 600° C. and about 800° C. Chemical vapor deposition of the oxide layer on a front surface of a device substrate, a front surface of a handle substrate, or on both front surfaces of a device substrate and a handle substrate generally proceeds until a silicon dioxide layer is formed having a thickness about 1 nanometer thick, such as between about 10 nanometers and about 5000 nanometers thick, such as between about 100 nanometers and about 1000 nanometers, or between about 200 nanometers and about 400 nanometers.

In some embodiments, the oxidation layer is relatively thin, such as between about 5 angstroms and about 25 angstroms, such as between about 10 angstroms and about 15 angstroms. In some embodiments, the semiconductor handle substrate may be oxidized by exposure to an aqueous solution comprising an oxidizing agent, such as an SC1 solution or an SC2 solution. In some embodiments, the SC1 solution comprises 5 parts deionized water, 1 part aqueous $NH_4OH$ (ammonium hydroxide, 29% by weight of $NH_3$), and 1 part of aqueous $H_2O_2$ (hydrogen peroxide, 30%). In some embodiments, the handle substrate may be oxidized by exposure to an aqueous solution comprising an oxidizing agent, such as an SC2 solution. In some embodiments, the SC2 solution comprises 5 parts deionized water, 1 part aqueous HCl (hydrochloric acid, 39% by weight), and 1 part of aqueous $H_2O_2$ (hydrogen peroxide, 30%).

In some embodiments, the oxidation layer 120 comprises a porous oxide or a carbon-doped oxide. These types of oxidation layers may be deposited by CVD techniques. The ambient atmosphere may comprise an organo-silicate precursor, and the deposition method is generally the same as the above described CVD techniques. In some embodiments, the ambient atmosphere comprises an organo-silicate precursor, such as tetraethylorthosilicate, or an organosilane. Deposition is performed in a low temperature environment with low oxidant concentration. The low oxygen concentration in the ambient atmosphere provides insufficient reactivity for complete oxidation of the precursor, resulting in a film including some organic, i.e., carbon, content. The CVD process is thermal or plasma enhanced. To create a porous layer, the deposited film is treated to remove the organic groups, leaving a low density porous silica film. The organic groups can be removed, for example, by heating in a furnace in an oxidizing environment, oxidizing plasma, or by exposure to a combination of ultraviolet light and ozone.

In some embodiments, the oxidation layer 120 comprises a spin-on-oxide, which is prepared by contacting the substrate with a dissolved spin-on-glass material. The dissolved spin-on-glass material is available commercially. It is coated onto the semiconductor wafer by spinning at high speed (spin on oxide materials may be acquired from Tokyo Electron Limited). The spin-on-glass material fills uneven topography of the wafer, thereby planarizing it. After spinning onto a substrate, solvents are baked off via a low temperature anneal. The wafer is then heated in vacuum, an oxidizing ambient atmosphere, or a non-oxidizing ambient atmosphere to a temperature between about 400° C. and about 900° C. This cures and densifies the layer.

According to the method of the present invention, the oxidation layer 120 deposited at least upon the front surface 102 of the single crystal semiconductor handle substrate 100, and which optionally envelopes the single crystal semiconductor handle substrate 100, preferably has a higher wet etch rate ratio compared to thermally deposited semiconductor oxide. In general, a wet etch rate may be expressed in absolute terms (e.g., nm/min), but the uncertainty in etchant condition (temperature, concentration, etc.) makes a ratio a more convenient number. The ratio for typical HF etching of oxides is with respect to a thermal oxide. Thermal oxide is naturally the highest quality oxide, and its wet etch rate ratio is normalized at 1 for a HF etch. In generally, oxide layers prepared by other techniques have wet etch rate ratio of greater than 1, i.e., they etch at a greater rate than thermal oxide for any given wet etch solution. In some embodiments, a wet etch rate ratio may be determined by conducting a simultaneous wet etch of two handle substrates, one of which comprises a thermal oxide layer and the other of which comprises a weak oxide layer, e.g., a CVD oxide layer. The thicknesses of the respective oxide layers are measured prior to contact with an etchant solution. The oxide layers are exposed to an etchant solution for a duration and at a temperature suitable for etching the oxide layers. For purposes of determining the etch rate ratio, the etchant solution, duration, and temperature should be selected such that a measurable amount of oxide is removed from each oxide layer and in a consistent manner such that the amount of oxide removed is predominantly determined by the type of oxide layer rather than the precise etchant solution, duration and temperature selected. For example, and identical etching solution, duration and temperature may be used or alternatively they may vary somewhat provided the variation does not measurably effect the relative amounts of oxide removed. It should be noted that in this same regard, the etching steps may be performed sequentially rather than simultaneously provided the conditions are maintained such that the relevant amounts of oxide removed is determined by the differences in the oxide layers rather than the etching conditions. The thicknesses of the respective oxide layers are measured after the etching operation. The thicknesses of each layer that were etched is calculated by subtracting the final thickness from the starting thickness. The wet etch rate ratio may be calculated by dividing the etched thickness of the weak oxide layer, e.g., CVD oxide, by the etched thickness of the thermal oxide layer. For example, if 20 nanometers of the weak oxide layer was etched, and 10 nanometers of the thermal oxide layer was etched, the wet etch rate ratio is 2. In some embodiments, the wet etch rate ratio may be calculated by dividing the etch rate in nm/min of a weak oxide layer by the etch rate in nm/min of a thermal oxide layer. For example, a weak oxide layer may etch in a buffered oxide etch solution (e.g., 6:1 volume ratio of 40% $NH_4F$ in water:49% HF in water, at room temperature) a rate of about 200 nm/min, and a thermal oxide layer may etch in the same solution at a rate of about 100 nm/min. According to this example, the wet etch rate ratio is about 2. In yet another example, a weak oxide layer may etch in dilute HF (100:1 ratio) at a rate greater than about 4 nm/min, and a thermal oxide layer may etch in the same solution at a rate of about 2 nm/min. According to this example, the wet etch rate ratio is at least about 2. According to the present invention, an oxidation layer 120 is deposited which has a wet etch rate ratio greater than 2, preferably greater than 3, and even more preferably greater than 5.

II. Plasma Treatment

In some embodiments, the oxidized single crystal semiconductor handle substrate 100, particularly the oxidized front surface, is subjected to plasma treatment, e.g., an oxygen plasma treatment and/or nitrogen plasma treatment. In some embodiments, the oxygen plasma and/or nitrogen plasma surface activation tool is a commercially available tool, such as those available from EV Group, such as EVG®810LT Low Temp Plasma Activation System. General requirements of a plasma CVD chamber include a reactor with various electrode designs, power generation electronics, impedance matching network to transfer power to the gas load, mass flow controllers for input gasses, and pressure control systems. Typical systems are vertical tube reactors powered by an inductively or capacitively coupled RF source. The single crystal semiconductor handle substrate 100 comprising the oxidation layer 120 is loaded into the chamber and placed on a heated support chamber. The chamber is evacuated and backfilled with $O_2$ to a pressure less than atmospheric to thereby create the plasma. The single crystal semiconductor donor wafer is exposed to this plasma for the desired time, which may range from about 1 second to about 120 seconds. Oxygen plasma surface oxidation is performed in order to render the front surface of the single crystal semiconductor donor substrate hydrophilic and amenable to bonding to a single crystal semiconductor handle substrate prepared according to the method described above. According to the present invention, plasma treatment occurs for a shorter duration and/or at weaker power plasma activation, which results in a weaker bond between the handle substrate and the donor substrate.

III. Oxidation and Nitridation of the Single Crystal Semiconductor Donor Substrate According to the method of the present invention, and with reference to FIG. 2A, a single crystal semiconductor donor substrate 200 is oxidized. The single crystal semiconductor donor substrate 200 may be a single crystal semiconductor wafer. In preferred embodiments, the semiconductor wafer comprises a material selected from the group consisting of silicon, silicon carbide, silicon germanium, gallium arsenide, gallium nitride, indium phosphide, indium gallium arsenide, germanium, and combinations thereof. Depending upon the desired properties of the final integrated circuit device, the single crystal semiconductor (e.g., silicon) donor wafer 200 may comprise electrically active dopants, such as boron (p type), gallium (p type), aluminum (p type), indium (p type), phosphorus (n type), antimony (n type), and arsenic (n type). The resistivity of the single crystal semiconductor (e.g., silicon) donor wafer may range from 1 to 50 Ohm-cm, typically, from 5 to 25 Ohm-cm. The single crystal semiconductor donor wafer 200 may be subjected to standard process steps including oxidation, implant, and post implant cleaning.

Figure 2A:
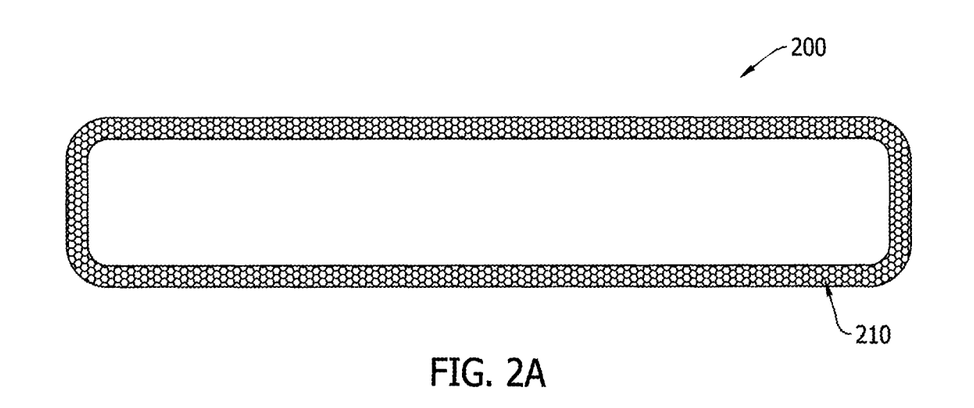
FIGS. 2A through 2D depict a process flow according to some embodiments of the present invention.

In some embodiments, the single crystal semiconductor donor substrate 200 may be thermally oxidized in a furnace such as an ASM A400. As stated herein, thermally prepared oxidation layers are more resistant to wet etch than oxidation layers prepared by other techniques. During a subsequent etch, the thermal oxidation layer on the donor substrate resists etching more than the CVD-deposition oxide layer on the handle substrate. The temperature may range from 750° C. to 1100° C. in an oxidizing ambient. The oxidizing ambient atmosphere can be a mixture of inert gas, such as Ar or $N_2$, and $O_2$. The oxygen content may vary from 1 to 10 percent, or higher. In some embodiments, the oxidizing ambient atmosphere may be up to 100% (a "dry oxidation"). In some embodiments, the ambient atmosphere may comprise a mixture of inert gas, such as Ar or $N_2$, and oxidizing gases, such as $O_2$ and water vapor (a "wet oxidation"). In an exemplary embodiment, the single crystal semiconductor donor substrate 200 may be loaded into a vertical furnace, such as an A400. The temperature is ramped to the oxidizing temperature with a mixture of $N_2$ and $O_2$. At the desired temperature water vapor is introduced into the gas flow. After the desired oxide thickness has been obtained, the water vapor and $O_2$ are turned off and the furnace temperature is reduced and wafers are unloaded from the furnace. The oxidation layer 210 may envelope the single crystal semiconductor donor substrate 200. The oxidation layer may be at least about 1 nanometer thick, such as at least about 10 nanometers thick, such as between about 10 nanometers and about 10,000 nanometers, between about 10 nanometers and about 5,000 nanometers, between 50 nanometers and about 400 nanometers, or between about 100 nanometers and about 400 nanometers, such as about 50 nanometers, 100 nanometers, or 200 nanometers. In some embodiments, the oxidation layer is relatively thin, such as between about 5 angstroms and about 25 angstroms, such as between about 10 angstroms and about 15 angstroms.

Figure 2B:
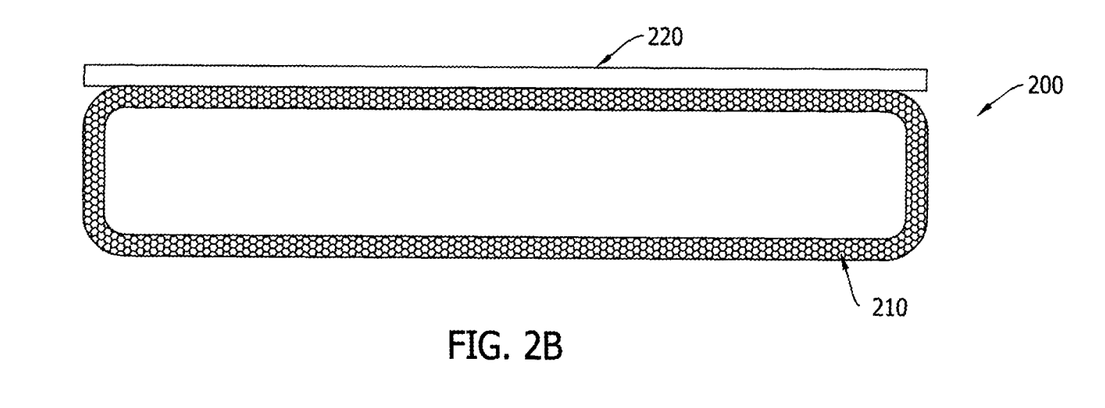

In some embodiments, and with reference to FIG. 2B, a nitride or oxynitride layer 220 may be formed on the oxide layer 210. In some embodiments, an insulating layer comprising a semiconductor nitride (e.g., silicon nitride) is deposited by a nitrogen plasma treatment. In some embodiments, an insulating layer comprising a semiconductor oxynitride (e.g., silicon oxynitride) is deposited by a plasma treatment comprising nitrogen and oxygen precursors. In some embodiments, the oxygen plasma and/or nitrogen plasma surface activation tool is a commercially available tool, such as those available from EV Group, such as EVG®810LT Low Temp Plasma Activation System. General requirements of a plasma enhanced CVD chamber include a reactor with various electrode designs, power generation electronics, impedance matching network to transfer power to the gas load, mass flow controllers for input gasses, and pressure control systems. Typical systems are vertical tube reactors powered by an inductively coupled RF source. The single crystal semiconductor donor substrate 200 having the oxide layer 210 is loaded into the chamber and placed on a heated support chamber. The chamber is evacuated and backfilled with an oxygen gas source and/or a nitrogen gas source in a carrier gas, such as argon, to a pressure less than atmospheric to thereby create the plasma. Oxygen and/or water are suitable source gases for plasma oxide treatment. Ammonia and/or nitrogen and/or nitric oxide (NO) and/or nitrous oxide ($N_2O$) gas are suitable source gases for plasma nitride treatment. Oxynitride films may be deposited by including oxygen and nitrogen gas sources. Additionally, the use of nitric oxide or nitrous oxide additionally incorporates oxygen in to the insulating layer, thereby depositing an oxynitride film. To deposit a silicon nitride or a silicon oxide plasma film, suitable silicon precursors include methyl silane, silicon tetrahydride (silane), trisilane, disilane, pentasilane, neopentasilane, tetrasilane, dichlorosilane ($SiH_2Cl_2$), trichlorosilane ($SiHCl_3$), silicon tetrachloride ($SiCl_4$), among others. Suitably, Ar is added as a carrier gas.

The single crystal silicon donor substrate is subjected to plasma treatment to deposit an insulating layer comprising semiconductor nitride (e.g., silicon nitride) or semiconductor oxynitride (e.g., silicon oxynitride). The substrates may be subjected to plasma deposition without the deposition of any additional layers, other than the thermal oxide layer. Alternatively, one or more insulating layers may be deposited upon the substrates, and plasma enhanced CVD may be used to deposit additional insulating layers upon the insulating layers deposited according to other techniques.

Plasma deposition may be varied to tune the properties of the semiconductor nitride (e.g., silicon nitride) or semiconductor oxynitride (e.g., silicon oxynitride). For example, the pressure, flow rate, temperature, and relative ratio of precursors, e.g., ratio of $NH_3$ to $N_2O$ gases, may tune the silicon and nitride molar ratios of the plasma deposited nitride layer. Additionally, inclusion of an oxygen precursor incorporates oxygen to prepare an oxynitride layer. In some embodiments, plasma deposition may occur in an ambient atmosphere comprising silicon and nitrogen precursors to thereby deposit a silicon nitride layer on the handle substrate and/or donor substrate. After a duration sufficient to deposit nitride, an oxygen precursor may be introduced into the atmosphere to thereby deposit oxynitride. The oxygen concentration in the handle semiconductor oxynitride layer may vary according to a gradient, whereby the oxygen concentration is low at the interface with the handle semiconductor nitride layer and increases in the perpendicular direction away from the surface of the handle semiconductor oxynitride layer. After a duration sufficient to deposit an oxynitride layer, the flow of the nitrogen precursor may be ceased and deposition may continue only with silicon precursor and an oxygen gas source to thereby deposit an insulating layer comprising semiconductor oxide, e.g., silicon oxide. In some embodiments, a dielectric layer may be deposited by plasma techniques comprising a semiconductor nitride (e.g., silicon nitride) layer and a semiconductor oxynitride (e.g., silicon oxynitride) layer. In some embodiments, a dielectric layer may be deposited by plasma techniques comprising a semiconductor nitride (e.g., silicon nitride) layer, a semiconductor oxynitride (e.g., silicon oxynitride) layer, and a semiconductor oxide (e.g., silicon oxide) layer. Advantageously, plasma deposition of a dielectric layer comprising multiple insulating layers may occur continuously, i.e., without interruption, by varying the ratios and identities of the process gases.

The plasma deposited semiconductor nitride (e.g., silicon nitride), semiconductor oxynitride (e.g., silicon oxynitride), or semiconductor oxide (e.g., silicon oxide) may be formed at pressures between about 0.01 Torr and about 100 Torr, such as between about 0.1 Torr and about 1 Torr. Plasma deposition may occur at a temperature between about 20° C. and about 400° C. The insulating layer may be at least about 10 nanometer thick, such as between about 10 nanometers and about 10,000 nanometers, between about 10 nanometers and about 5,000 nanometers, between 50 nanometers and about 400 nanometers, or between about 100 nanometers and about 400 nanometers, such as about 50 nanometers, 100 nanometers, or 200 nanometers Insulating layers having a thickness between about 500 angstroms and about 10,000 angstroms can be deposited by PECVD at a rate between about 100 angstroms/minute and about 1000 angstroms/minute.

The flow rate ratios of the gaseous silicon precursor and the gaseous nitrogen precursor may be between about 1/200 and about 1/50, such as about 1/100. These ratios may yield a silicon nitride layer having a molar ratio of silicon to nitride of between about 0.7 and about 1.8. Oxygen may be incorporated in the plasma process, by adding an oxygen containing species such as oxygen or NO. Adding oxygen during plasma deposition enables the deposition of dielectric layers having compositions that vary in a gradient fashion, e.g., the layer may transition from semiconductor nitride (e.g., silicon nitride) to semiconductor oxynitride (e.g., silicon oxynitride) of increasing oxygen concentration to semiconductor oxide (e.g., silicon oxide).

The refractive index of the insulating layers may be tuned in the range between about 1.2 and about 3, such as between about 1.4 and about 2, or between about 1.5 and about 2. Post processing anneal and chemical vapor deposition of silicon oxide, $SiO_2$, is possible to further tune the bond interface or hydrogen content of the film. The bonding between the handle substrate and the donor substrate benefits from roughness of less than about 5 angstroms, according to the root mean square method over a 2 micrometer by 2 micrometer surface area, $RMS_{2 \times 2 \, um2}$. Generally this can be achieved in a plasma deposition with controlled inductively coupled plasma and lowering the bias power below the roughening threshold. Successful layer transfer has been demonstrated on plasma deposited films with roughness of about 5 angstroms or less.

Silicon oxynitride comprises a material having a composition that has a chemical formula $Si_xO_yN_z$. In its amorphous form, the values of x, y, and z may vary continuously between $SiO_2$ (silicon dioxide) and $Si_3N_4$ (silicon nitride). Accordingly, in a silicon oxynitride layer, the values of y and z are both greater than 0. A known crystalline form of silicon oxynitride is $Si_2ON_2$. According to some embodiments, the silicon oxynitride may be deposited in a gradient fashion, such that the composition of the film and thus the refractive index of the film may vary in a gradient fashion. In some embodiments, silicon oxynitride may be deposited upon a silicon nitride film by the gradual introduction of an oxygen precursor (e.g., oxygen, water, $N_2O$) into the plasma deposition ambient atmosphere, which may comprise a silicon precursor and a nitrogen precursor, e.g., ammonia. The ratio of $NH_3:N_2O$ may be varied, that is, lowered, during deposition to gradually increase the oxygen content in the silicon oxynitride layer. In some embodiments, after deposition of a gradient silicon oxynitride layer, all nitrogen precursors are eliminated from the plasma deposition atmosphere, and the atmosphere contains silicon precursors and oxygen precursors, which enables deposition of a silicon dioxide layer on the silicon oxynitride layer. According to some embodiments, the refractive index range of the silicon oxynitride film may vary between 2.0 for silicon nitride and 1.45 for silicon dioxide.

Silicon nitride produced from plasma is structurally distinct from silicon nitride deposited according to conventional chemical or physical vapor deposition techniques. Conventional CVD or PVD deposition generally results in a silicon nitride layer having a stoichiometry of $Si_3N_4$. Plasma processes can be controlled to deposit a film having a composition such as $Si_xN_yH_z$ depending on the ratios of input reactant gasses, power level, substrate temperature, and overall reactor pressure. Pathways in a plasma system exist to form Si—N, Si=N and Si≡N bonds. This is due to the fact that plasma energies are a hammer that produce $Si_xH_z$ and $N_yH_z$ species. For example, the refractive index and optical gap change dramatically with the Si/N ratio. At higher silane concentrations, the films become Si rich and may reach an index of refraction up to 3.0 (compared to 2 for LPCVD). Other properties that may be influenced include dielectric constant, breakdown, mechanical, and chemical (etch rate).

IV. Preparation of a Cleave Plane in the Single Crystal Semiconductor Donor Substrate With reference to FIGS. 2C and 2D, a process is illustrated whereby a cleave plane is formed in a single crystal semiconductor donor substrate 200, e.g., a single crystal semiconductor donor wafer and oxidation layer 210 and a nitride layer 220. Accordingly, a single crystal semiconductor donor substrate 200, such as a single crystal semiconductor wafer of a material that is conventionally used in preparation of multilayer semiconductor structures, e.g., a single crystal silicon donor wafer is subjected to ion implantation to form a damage layer in the donor substrate.

Figure 2C:
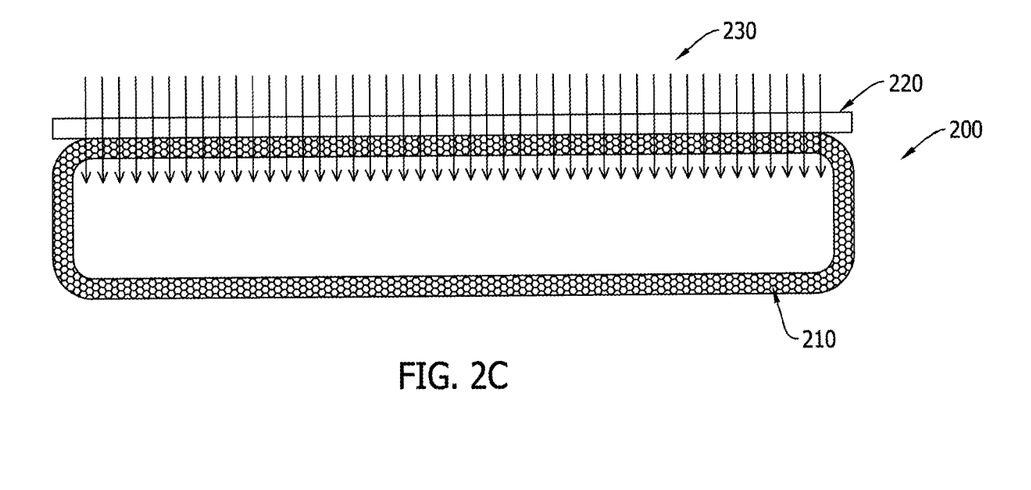
Figure 2D:
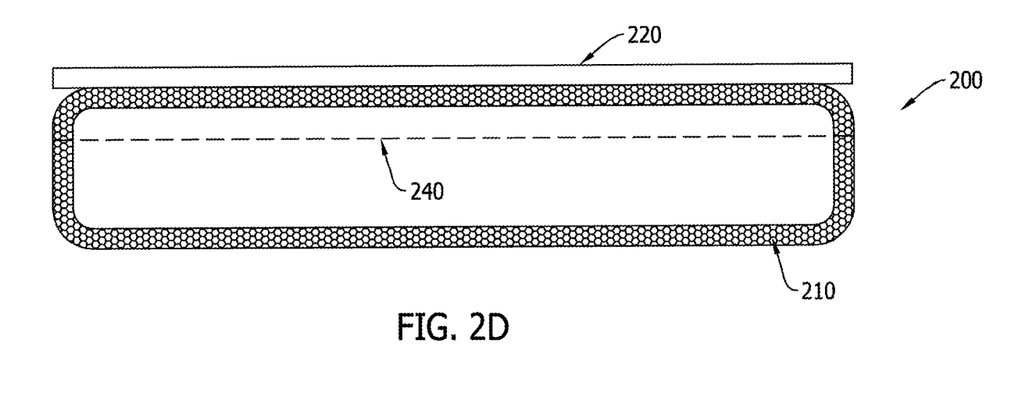

Ion implantation 230 of a single crystal semiconductor donor substrate 200 to thereby prepare a cleave plane 240 may be carried out in a commercially available instrument, such as an Applied Materials Quantum II, a Quantum LEAP, or a Quantum X. Implanted ions include He, H, $H_2$, or combinations thereof. Ion implantation is carried out as a density and duration sufficient to form a damage layer in the semiconductor donor substrate. Implant density may range from about $10^{12}$ ions/cm$^2$ to about $10^{17}$ ions/cm$^2$, such as from about $10^{14}$ ions/cm$^2$ to about $10^{17}$ ions/cm$^2$, such as from about $10^{15}$ ions/cm$^2$ to about $10^{16}$ ions/cm$^2$. Implant energies may range from about 1 keV to about 3,000 keV, such as from about 10 keV to about 3,000 keV. Implant energies may range from about 1 keV to about 3,000 keV, such as from about 5 keV to about 1,000 keV, or from about 5 keV to about 200 keV, or from 5 keV to about 100 keV, or from 5 keV to about 80 keV. The depth of implantation determines the thickness of the single crystal semiconductor device layer in the final SOI structure. The ions may be implanted to a depth between about 100 angstroms and about 30,000 angstroms, such as between about 200 angstroms and about 20,000 angstroms, such as between about 2000 angstroms and about 15,000 angstroms, or between about 15,000 angstroms and about 30,000 angstroms. In some embodiments it may be desirable to subject the single crystal semiconductor donor substrate 200, e.g., single crystal silicon donor wafer, to a clean after the implant. In some preferred embodiments, the clean could include a Piranha clean followed by a DI water rinse and SC1/SC2 cleans.

In some embodiments of the present invention, the single crystal semiconductor donor substrate 200 having an ion implant region therein formed by $He^+$, $H^+$, $H_2^+$, and any combination thereof ion implant is annealed at a temperature sufficient to form a thermally activated cleave plane 240 in the single crystal semiconductor donor substrate 200. An example of a suitable tool might be a simple Box furnace, such as a Blue M model. In some preferred embodiments, the ion implanted single crystal semiconductor donor substrate 200 is annealed at a temperature of from about 200° C. to about 350° C., from about 225° C. to about 325° C., preferably about 300° C. Thermal annealing may occur for a duration of from about 2 hours to about 10 hours, such as from about 2 hours to about 8 hours. Thermal annealing within these temperatures ranges is sufficient to form a thermally activated cleave plane. After the thermal anneal to activate the cleave plane, the single crystal semiconductor donor substrate surface is preferably cleaned.

In some embodiments, the ion-implanted and optionally cleaned and optionally annealed single crystal semiconductor donor substrate is subjected to oxygen plasma and/or nitrogen plasma surface activation. In some embodiments, the oxygen plasma surface activation tool is a commercially available tool, such as those available from EV Group, such as EVG®810LT Low Temp Plasma Activation System. The ion-implanted and optionally cleaned single crystal semiconductor donor wafer is loaded into the chamber. The chamber is evacuated and backfilled with $O_2$ to a pressure less than atmospheric to thereby create the plasma. The single crystal semiconductor donor wafer is exposed to this plasma for the desired time, which may range from about 1 second to about 120 seconds. Oxygen plasma surface oxidation is performed in order to render the front surface of the single crystal semiconductor donor substrate hydrophilic and amenable to bonding to a single crystal semiconductor handle substrate prepared according to the method described above.

V. Preparation of the Bonded Structure

Figure 3:
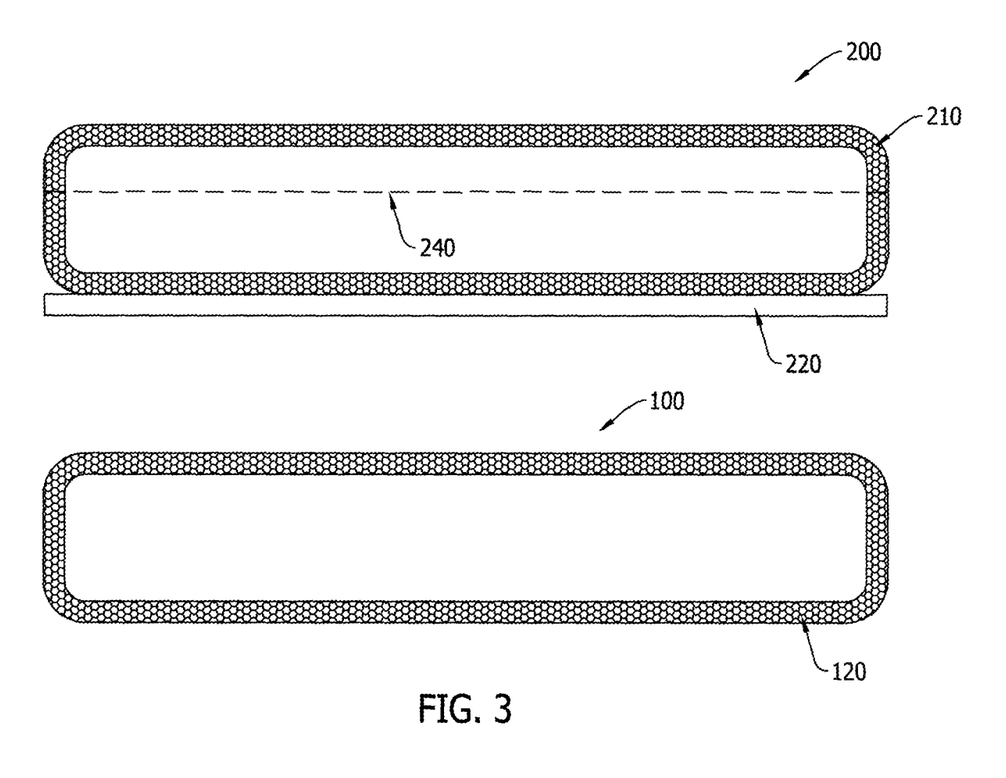
FIG. 3 depicts a process step according to some embodiments of the present invention.
Figure 4:
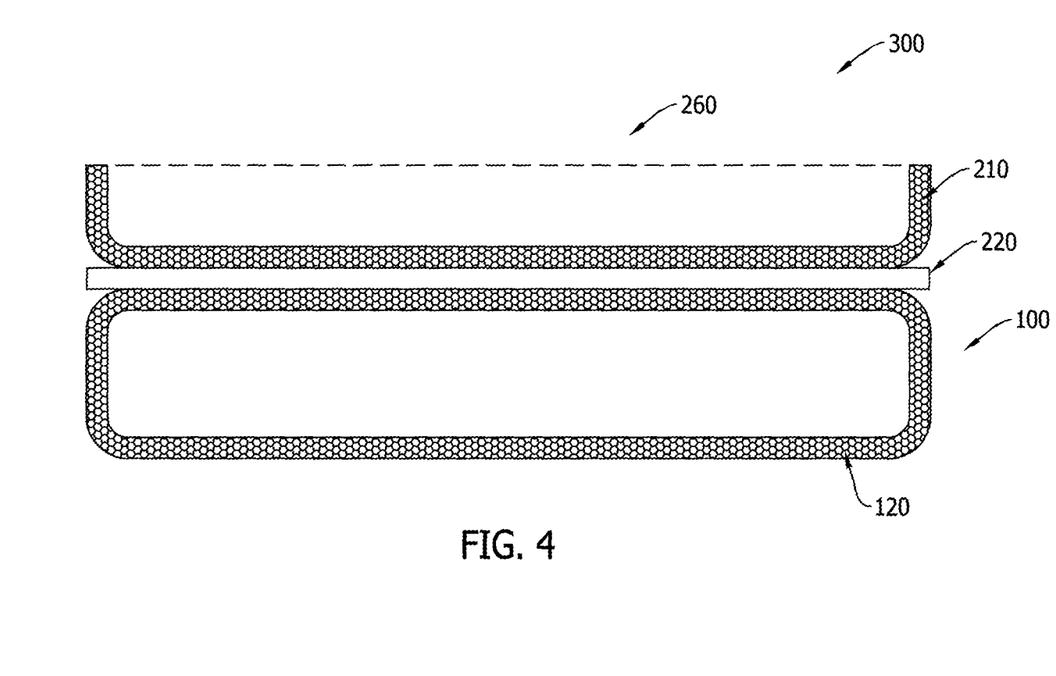
FIG. 4 depicts a multilayer structure prepared according to some embodiments of the present invention.

With reference to FIGS. 3 and 4, the single crystal semiconductor donor substrate 200 comprising the oxide layer 210 and the nitride layer 220 and the single crystal semiconductor handle substrate 100 comprising the oxide layer 120 are next brought into intimate contact to thereby form a bonded structure. Since the mechanical bond may be relatively weak, the bonded structure may be further annealed to solidify the bond between the silicon nitride layer 220 of the single crystal semiconductor donor substrate 100 and the oxide layer 120 of the single crystal semiconductor handle substrate 100. An example of a suitable tool might be a simple Box furnace, such as a Blue M model. In some embodiments, the bonded structure is annealed at a temperature of from about 200° C. to about 400° C., from about 300° C. to about 400° C., such as from about 350° C. to about 400° C. Generally, the anneal is of shorter duration and temperature to thereby limit the strength of the bond.

After the thermal anneal, the bond between the single crystal single crystal semiconductor donor substrate 200 and the single crystal semiconductor handle substrate 100 is strong enough to initiate layer transfer via cleaving the bonded structure at the cleave plane. Cleaving may occur according to techniques known in the art. In some embodiments, the bonded structure may be placed in a conventional cleave station affixed to stationary suction cups on one side and affixed by additional suction cups on a hinged arm on the other side. A crack is initiated near the suction cup attachment and the movable arm pivots about the hinge cleaving the wafer apart. Cleaving removes a portion of the semiconductor donor wafer, thereby leaving a single crystal semiconductor device layer 260, preferably a silicon device layer, on the semiconductor-on-insulator composite structure. See FIG. 4.

After the cleave, the bonded structure may be subjected to a cleaning process designed to remove thin thermal oxide and clean particulates from the surface. In some embodiments, the single crystal semiconductor device layer may be brought to the desired thickness and smoothness by subjecting to a vapor phase HCl etch process in a horizontal flow single wafer epitaxial reactor using $H_2$ as a carrier gas. In some embodiments, the semiconductor device layer 260 may have a thickness between about 20 nanometers and about 3 micrometers, such as between about 20 nanometers and about 2 micrometers, such as between about 20 nanometers and about 1.5 micrometers or between about 1.5 micrometers and about 3 micrometers.

In some embodiments, an epitaxial layer may be deposited on the transferred single crystal semiconductor device layer 260. A deposited epitaxial layer may comprise substantially the same electrical characteristics as the underlying single crystal semiconductor device layer 260. Alternatively, the epitaxial layer may comprise different electrical characteristics as the underlying single crystal semiconductor device layer 260. An epitaxial layer may comprise a material selected from the group consisting of silicon, silicon carbide, silicon germanium, gallium arsenide, gallium nitride, indium phosphide, indium gallium arsenide, germanium, and combinations thereof. Depending upon the desired properties of the final integrated circuit device, the epitaxial layer may comprise electrically active dopants, such as boron (p type), gallium (p type), aluminum (p type), indium (p type), phosphorus (n type), antimony (n type), and arsenic (n type). The resistivity of the epitaxial layer may range from 1 to 50 Ohm-cm, typically, from 5 to 25 Ohm-cm. In some embodiments, the epitaxial layer may have a thickness between about 20 nanometers and about 3 micrometers, such as between about 20 nanometers and about 2 micrometers, such as between about 20 nanometers and about 1.5 micrometers or between about 1.5 micrometers and about 3 micrometers.

VI. Preferential Etching

Figure 5:
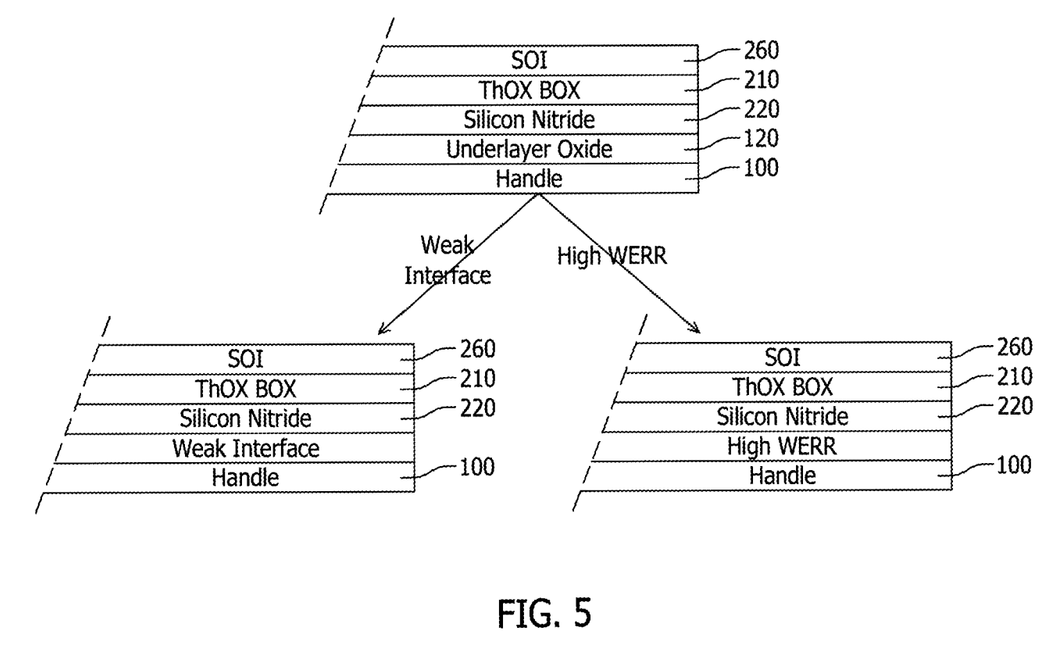
FIG. 5 depicts a process flow according to some embodiments of the present invention.

With reference to FIG. 5, in some embodiments, the structure is subjected to an etch to thereby remove the oxide layer 120 and the single crystal semiconductor handle substrate 100. According to the process disclosed herein, the oxide layer 120 is more susceptible to etching than the thermally deposited oxide layer 210 located between the single crystal semiconductor device layer 260 and the nitride layer 220. Additionally, the structure may be prepared to have a weak bond between the oxide layer 120 and the nitride layer 220. In some embodiments, the etching solution comprises hydrofluoric acid, and the etch may occur at room temperature. Typical usage is 100:1 or buffered solutions. Depending on the etch rate, the immersion duration can be 1 to 20 minutes, generally between about 8 minutes and about 12 minutes. The etch solution preferentially etches the high wet etch rate ratio oxide layer 120, thereby enabling the removal of the handle substrate 100 and the oxide layer 120, without significant etch of the thermally deposited oxide layer 210.

Figure 6:
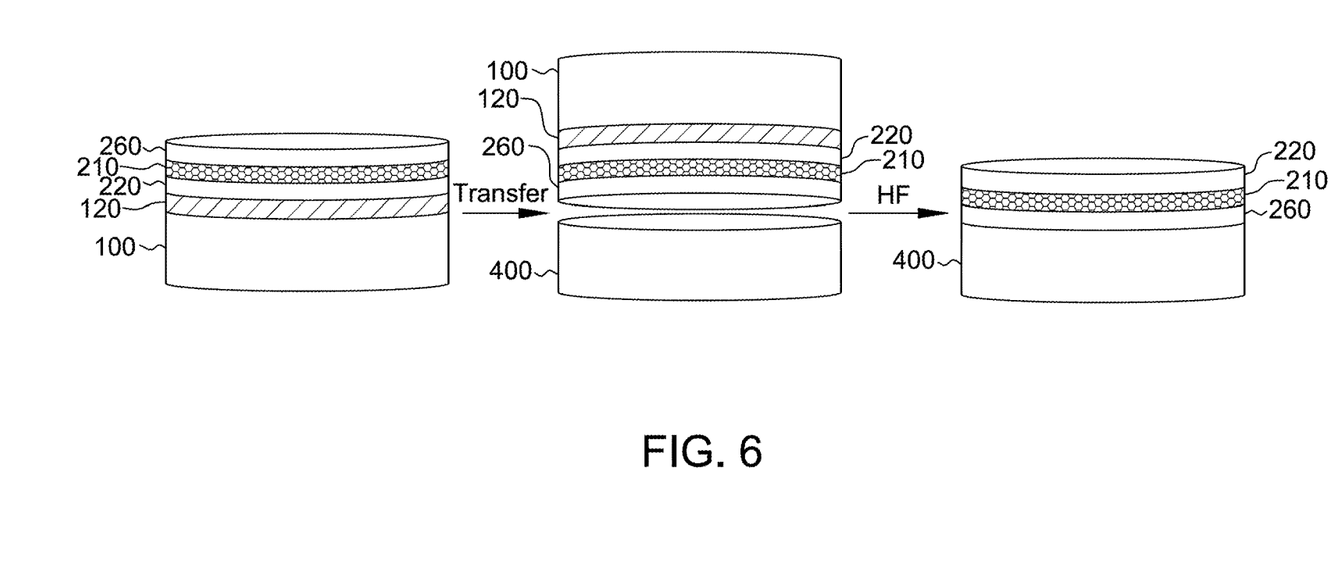
FIG. 6 depicts a process flow according to some embodiments of the present invention.

In some embodiments, and with reference to FIG. 6, the multilayer structure comprising a single crystal semiconductor handle substrate 100, an oxidation layer 120, a nitride layer 220, a thermally deposited oxide layer 210, and a single crystal semiconductor device layer 260 may be bonded to a target substrate 400 as depicted in FIG. 6. The target substrate 400 may be any substrate suitable for use in the fabrication of integrated circuit devices. That is, the target substrate 400 has electrical properties dictated by its end use. The bonded structure may be annealed in order to strengthen the bond between the single crystal semiconductor device layer 260 and the target substrate 400. Bonding conditions may be as disclosed herein. After bonding, the bonded structure may be subjected to an etch to remove the single crystal semiconductor handle substrate 100 and the oxidation layer 120. In some embodiments, the etching solution comprises hydrofluoric acid, and the etch may occur at room temperature. Typical usage is 100:1 or buffered solutions. Depending on the etch rate, the immersion duration can be 1 to 20 minutes, generally between about 8 minutes and about 12 minutes. The final structure comprising the nitride layer 220, the thermally deposited oxide layer 210, the single crystal semiconductor device layer 260, and the target substrate 400.

Having described the invention in detail, it will be apparent that modifications and variations are possible without departing from the scope of the invention defined in the appended claims.

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above products and methods without departing from the scope of the invention, it is intended that all matter contained in the above description and shown in the accompanying drawings shall be interpreted as illustrative and not in a limiting sense.

What is claimed is:

1. A method of preparing a multilayer structure, the method comprising:
    bonding a handle semiconductor oxide layer in interfacial contact with a front surface of a single crystal semiconductor handle substrate to a donor semiconductor nitride layer in interfacial contact with a donor semiconductor oxide layer in interfacial contact with a front surface of a single crystal semiconductor donor substrate to thereby prepare a bonded structure, wherein (i) the single crystal semiconductor donor substrate comprises two major, generally parallel surfaces, one of which is the front surface of the semiconductor donor substrate and the other of which is the back surface of the semiconductor donor substrate, a circumferential edge joining the front and back surfaces of the semiconductor donor substrate, a central plane between the front and back surfaces of the semiconductor donor substrate, and a bulk region between the front and back surfaces of the semiconductor donor substrate, wherein the single crystal semiconductor donor substrate comprises a cleave plane, (ii) the single crystal semiconductor handle substrate comprises two major, generally parallel surfaces, one of which is the front surface of the single crystal semiconductor handle substrate and the other of which is a back surface of the single crystal semiconductor handle substrate, a circumferential edge joining the front surface and the back surface of the single crystal semiconductor handle substrate, a central plane between the front surface and the back surface of the single crystal semiconductor handle substrate, and a bulk region between the front and back surfaces of the single crystal semiconductor handle substrate, and (iii) further wherein the handle semiconductor oxide layer comprises porous silicon dioxide and the handle semiconductor oxide layer has a wet etch rate ratio greater than 2.

2. The method of claim 1 wherein the single crystal semiconductor handle substrate comprises single crystal silicon.

3. The method of claim 1 wherein the single crystal semiconductor handle substrate comprises a single crystal silicon wafer sliced from a single crystal silicon ingot grown by the Czochralski method or the float zone method.

4. The method of claim 1 wherein the single crystal semiconductor donor substrate comprises single crystal silicon.

5. The method of claim 1 wherein the single crystal semiconductor donor substrate comprises a single crystal silicon wafer sliced from a single crystal silicon ingot grown by the Czochralski method or the float zone method.

6. The method of claim 1 further comprising selectively etching the handle semiconductor oxide layer having the wet etch rate ratio greater than 2.

7. The method of claim 1 wherein the handle semiconductor oxide layer has a wet etch rate ratio greater than 3.

8. The method of claim 7 further comprising selectively etching the handle semiconductor oxide layer having the wet etch rate ratio greater than 3 to thereby yield a structure comprising single crystal semiconductor donor substrate, the donor semiconductor oxide layer, and the donor semiconductor nitride layer.

9. The method of claim 1 wherein the handle semiconductor oxide layer has a wet etch rate ratio greater than 5.

10. The method of claim 9 further comprising selectively etching the handle semiconductor oxide layer having the wet etch rate ratio greater than 5 to thereby yield a structure comprising single crystal semiconductor donor substrate, the donor semiconductor oxide layer, and the donor semiconductor nitride layer.

11. The method of claim 1 wherein the handle semiconductor oxide layer has a thickness greater than 200 nanometers.

12. The method of claim 1 wherein the handle semiconductor oxide layer has a refractive index between 1.2 and 3.

13. The method of claim 1 further comprising plasma activating the handle semiconductor oxide layer in interfacial contact with a front surface of a single crystal semiconductor handle substrate prior to bonding.

14. The method of claim 1 wherein the donor semiconductor oxide layer has a thickness greater than 100 nanometers.

15. The method of claim 1 wherein the donor semiconductor nitride layer has a refractive index between 3.0 and 2.0.

16. The method of claim 1 wherein the donor semiconductor nitride layer has a thickness between about 500 angstroms and about 10,000 angstroms.

17. The method of claim 1 wherein the donor semiconductor nitride layer comprises silicon nitride.

18. The method of claim 17 wherein the silicon nitride has a molar ratio of silicon to nitride of between about 0.7 and about 1.8.

19. The method of claim 1 further comprising mechanically cleaving the bonded structure at the cleave plane of the single crystal semiconductor donor substrate to thereby prepare a cleaved structure comprising the single crystal semiconductor handle substrate, the handle semiconductor oxide layer, the donor semiconductor nitride layer, the donor semiconductor oxide layer, and a single crystal semiconductor device layer.

20. The method of claim 19 further comprising etching the cleaved structure to thereby remove the single crystal semiconductor handle substrate and the handle semiconductor oxide layer to thereby prepare a device structure comprising the donor semiconductor nitride layer, the donor semiconductor oxide layer, and the single crystal semiconductor device layer.

21. The method of claim 20 further comprising bonding the single crystal semiconductor device layer to a target substrate.

22. A method of preparing a multilayer structure, the method comprising:
bonding a handle semiconductor oxide layer in interfacial contact with a front surface of a single crystal semiconductor handle substrate to a donor semiconductor nitride layer in interfacial contact with a donor semiconductor oxide layer in interfacial contact with a front surface of a single crystal semiconductor donor substrate to thereby prepare a bonded structure, wherein (i) the single crystal semiconductor donor substrate comprises two major, generally parallel surfaces, one of which is the front surface of the semiconductor donor substrate and the other of which is the back surface of the semiconductor donor substrate, a circumferential edge joining the front and back surfaces of the semiconductor donor substrate, a central plane between the front and back surfaces of the semiconductor donor substrate, and a bulk region between the front and back surfaces of the semiconductor donor substrate, wherein the single crystal semiconductor donor substrate comprises a cleave plane, (ii) wherein the donor semiconductor nitride layer comprises a gradient wherein the donor semiconductor nitride layer comprises semiconductor nitride bonded to the handle semiconductor oxide layer and semiconductor oxynitride in interfacial contact with the donor semiconductor oxide layer and (iii) the single crystal semiconductor handle substrate comprises two major, generally parallel surfaces, one of which is the front surface of the single crystal semiconductor handle substrate and the other of which is a back surface of the single crystal semiconductor handle substrate, a circumferential edge joining the front surface and the back surface of the single crystal semiconductor handle substrate, a central plane between the front surface and the back surface of the single crystal semiconductor handle substrate, and a bulk region between the front and back surfaces of the single crystal semiconductor handle substrate, and further wherein the handle semiconductor oxide layer has a wet etch rate ratio greater than 2.

23. The method of claim 22 wherein the semiconductor oxynitride has a refractive index between 2.0 and 1.45.

* * * * *